(12) United States Patent
Ray

(10) Patent No.: US 10,135,475 B1
(45) Date of Patent: Nov. 20, 2018

(54) DYNAMIC LOW-LATENCY PROCESSING CIRCUITS USING INTERLEAVING

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/729,791

(22) Filed: Oct. 11, 2017

(51) Int. Cl.
| | |
|---|---|
| *H03M 1/00* | (2006.01) |
| *H04B 1/10* | (2006.01) |
| *H04H 40/18* | (2008.01) |
| *H03M 13/27* | (2006.01) |

(52) U.S. Cl.
CPC .......... *H04B 1/1027* (2013.01); *H03M 13/27* (2013.01); *H04H 40/18* (2013.01); *H03M 2201/176* (2013.01)

(58) Field of Classification Search
CPC ...... H03M 1/12; H03M 1/124; H03M 1/0626; H03M 1/1023; H03M 1/00; H03M 1/001; H03M 1/0607; H03M 1/0634; H03M 1/1042; H03M 1/1061; H03M 1/1205; H03M 1/1225
USPC .......................................... 341/140, 141, 155
See application file for complete search history.

(56) References Cited

U.S. PATENT DOCUMENTS

| | | | |
|---|---|---|---|
| 5,568,142 A * | 10/1996 | Velazquez | H03H 17/0266 341/126 |
| 6,876,321 B1 | 4/2005 | Slutzky et al. | |
| 7,242,346 B1 | 7/2007 | Slutzky et al. | |
| 7,253,761 B1 * | 8/2007 | Hoyos | H03M 1/121 341/143 |
| 8,836,557 B2 * | 9/2014 | Eldar | H03K 5/00 327/91 |
| 9,046,593 B2 | 6/2015 | Ray | |
| 2006/0232460 A1 * | 10/2006 | Huang | H03M 1/1019 341/155 |
| 2006/0239389 A1 * | 10/2006 | Coumou | H03M 1/0836 375/346 |

(Continued)

OTHER PUBLICATIONS

Aishwarya et al., "Pulse digitizer generator for ESM systems", Int'l J. Engineering Trends and Technology, vol. 4, Issue 3, Sep. 2013, pp. 3809-3813.

(Continued)

*Primary Examiner* — Linh Nguyen
(74) *Attorney, Agent, or Firm* — Ostrager Chong Flaherty & Broitman P.C.

(57) ABSTRACT

Systems and methods for processing a multitude of variable and varying signals in real time with low latency using fixed hardware with fixed processing resources, such as those within an application-specific integrated circuit (ASIC) or a field-programmable gated array (FPGA). The signal processing systems and methods allow the resource allocation to continuously adjust their processing as a result of changing signal conditions. In accordance with various embodiments, fixed processing resources in ASIC or FPGA form are dynamically allocated through an intelligent interleaving methodology that efficiently maps the signal processing of incoming signals while essentially preserving the same latency as if each signal channel were processed at the full sample rate. This is accomplished by multiplexing under the control of a resource sharing algorithm.

22 Claims, 5 Drawing Sheets

(56) References Cited

U.S. PATENT DOCUMENTS

| | | | | |
|---|---|---|---|---|
| 2007/0133722 A1* | 6/2007 | Agazzi | ............... | H03M 1/0626 |
| | | | | 375/346 |
| 2008/0158029 A1* | 7/2008 | Xu | ...................... | H03M 1/0626 |
| | | | | 341/120 |
| 2008/0169949 A1* | 7/2008 | Xu | ...................... | G01R 19/2509 |
| | | | | 341/120 |
| 2008/0291064 A1* | 11/2008 | Johansson | ............ | H03M 1/0836 |
| | | | | 341/94 |
| 2009/0033529 A1* | 2/2009 | Raz | ...................... | H03M 1/1033 |
| | | | | 341/120 |
| 2012/0075129 A1* | 3/2012 | Kidambi | ............. | H03M 1/1052 |
| | | | | 341/118 |
| 2012/0176260 A1* | 7/2012 | Asami | ................. | H03M 1/1033 |
| | | | | 341/120 |
| 2013/0093607 A1* | 4/2013 | Yasuda | ................... | H03M 9/00 |
| | | | | 341/100 |
| 2014/0022101 A1* | 1/2014 | Hovakimyan | ...... | H03M 1/0626 |
| | | | | 341/118 |
| 2015/0188555 A1* | 7/2015 | Kimura | ............... | H03M 1/0634 |
| | | | | 341/118 |
| 2015/0333942 A1* | 11/2015 | Land | ....................... | H04L 27/18 |
| | | | | 375/279 |
| 2017/0141786 A1* | 5/2017 | Volfbeyn | ............... | H03D 7/165 |

OTHER PUBLICATIONS

Mahmoud et al., "Radar Parameter Generation to Identify the Target", Journal of Engineering, vol. 17, No. 1, Feb. 2011, pp. 173-185.

* cited by examiner

DYNAMIC LOW-LATENCY PROCESSING CIRCUITS USING INTERLEAVING

BACKGROUND

The technology disclosed herein generally relates to methods and apparatus for detecting and classifying repetitive signals.

A receiver system is any system configured to receive energy waves and process these energy waves to identify desired information carried in the energy waves. As used herein, an "energy wave" is a disturbance that propagates through at least one medium while carrying energy. For examples, energy waves may comprise electromagnetic waves, radio waves, microwaves, sound waves or ultrasound waves.

Typically, a receiver system includes a transducer and a receiver. A transducer may be any device configured to convert one type of energy into another type of energy. The transducers used in a receiver system are typically configured to receive energy waves and convert these energy waves into an electrical signal. An antenna is one example of a transducer. A receiver processes the electrical signal generated by a transducer to obtain desired information from the electrical signal. The desired information includes information about signals carried in the energy waves.

Oftentimes, energy waves are used to carry repetitive signals. A repetitive signal is a signal that has a time period over which some aspect of the signal repeats. Repetitive signals are used in timing operations, synchronization operations, radar operations, sonar operations, and other suitable operations. For example, the characteristics of a repetitive signal may be used to synchronize two or more devices. The characteristics of a repetitive signal can be described through a process known as signal descriptor word (SDW) generation that feeds the output from a wideband receiver.

Signal processing systems with fixed processing resources must adjust their processing to changing signal conditions. In particular, a SDW generator in a wideband receiver may receive many signals of different types, such as radar, navigation, communication, etc. These signals vary widely in bandwidth and hence they must be processed at rates commensurate with those bandwidths. Also, these signals collectively change over time from moment to moment as new ones enter and old ones leave. In addition, the receiver must describe each signal properly and with very low latency. Latency is extremely important in these contexts since there can be far too many signal samples to store for later processing and there can be very strict requirements on responding to certain of the signals as soon as they are detected. Also, this must be done on fixed hardware with fixed processing resources such as those within an application-specific integrated circuit (ASIC) or a field-programmable gated array (FPGA).

Previous solutions to process such widely various and varying signals involve running each channel or data stream at the full sample rate. While this is easy to design, such inefficient full-bandwidth processing is wasteful of computing resources, especially when used in FPGA and ASIC implementations. Accordingly, it would be desirable to provide enhanced systems and methods for processing widely various and varying signals on fixed hardware with low latency for all signals.

SUMMARY

The subject matter disclosed in detail below is directed to systems and methods for processing (e.g., describing) a multitude of variable and varying signals in real time with low latency using fixed hardware with fixed processing resources, such as those within an ASIC or FPGA. The signal processing systems and methods disclosed herein allow the resource allocation to continuously adjust their processing as a result of changing signal conditions. In accordance with various embodiments, fixed processing resources in ASIC or FPGA form are dynamically allocated through an intelligent interleaving methodology that efficiently maps the signal processing of incoming signals onto the fixed processing resources while essentially preserving the same latency as if each signal channel were processed at the full sample rate. This is accomplished by multiplexing under the control of a resource sharing algorithm.

In accordance with some embodiments, the system has the following features: (1) efficient mapping of signal processing of incoming signals onto a fixed set of existing FPGA or ASIC processing resources; (2) the ability to dynamically change mapping of processing to hardware as the incoming signal characteristics change; (3) the ability to control processing latency of all the incoming signals; and (4) an architecture that allows this dynamic remapping/interleaving of signals and algorithms using the concepts of dynamic input/output interleavers and virtual signal processing channels. These features provide benefits, including efficient and low-latency signal processing.

The methodology disclosed herein could be used in a wide variety of wideband radar or communication receivers that process a multitude of dynamically changing signals. In particular, the systems and methods proposed herein can be used, for example, to enhance PDW generation that feeds the output from an EW receiver.

Although various embodiments of systems and methods for processing a multitude of various and varying signals in real time with low latency using fixed hardware with fixed processing resources will be described in some detail below, one or more of those embodiments may be characterized by one or more of the following aspects.

One aspect of the subject matter disclosed in some detail below is a method for processing signals that vary in bandwidth, comprising: (a) sampling a received signal having a frequency within a specified bandwidth to produce signal samples; (b) generating signal information representing characteristics of the received signals, including estimated bandwidth of the received signals; (c) mapping signal processing of the received signal samples onto a fixed set of processing circuitry in accordance with an interleaving scheme, wherein the mapping is dynamically changed as the characteristics of the received signals change; (d) interleaving signal processing of the received signal samples by the processing circuitry in accordance with the mapping; (e) generating information vectors comprising respective data sets of parameter values of received signals; and (f) storing the data sets of parameter values of the information vectors in a non-transitory tangible computer-readable storage medium. In one exemplary application, this method further comprises: identifying a signal emitter based on the stored data sets of parameter values; locating the signal emitter; and sending control signals to an actuator controller of a vehicle, which control signals direct a movement of the vehicle based on a location of the signal emitter.

In accordance with one embodiment of the method described in the preceding paragraph, the mapping maps virtual channel numbers to respective circuits of the processing circuitry and step (c) comprises: using the signal information to look up in a circuit/algorithm table a circuit or sequence of circuits of the processing circuitry designed to process signal samples of a type based on the signal information; sending a virtual channel request to a multiplicity of dynamic input/output interleavers, which request includes data representing the estimated bandwidth of the received signals; determining in each dynamic input/output interleaver whether an empty slot exists for a compatible interleaving period that meets bandwidth requirements or not; and selecting from any dynamic input/output interleavers that have an empty slot a dynamic input/output interleaver with a smallest latency. Step (d) comprises setting up an interleaving buffer in a dynamic input/output interleaver and interleaving data with an associated virtual channel number as input to an associated circuit of the processing circuitry. Samples proceed through a circuit of the processing circuitry in a pipelined fashion, wherein the pipeline comprises only samples associated with the virtual channel that the circuit is part of. The processing circuitry produces a signal when current virtual channel processing is complete. In one application, step (e) comprises formatting an output vector that concatenates output from the dynamic input/output interleavers and the signal information representing characteristics of the received signals to form an information vector comprising data representing a pulse descriptor word.

Another aspect of the subject matter disclosed in some detail below is a system for processing signals that vary in bandwidth using dynamic interleaving, comprising: a multiplicity of physical processing units, each physical processing unit comprising a respective multiplicity of processing circuits configured to process signal samples in a pipelined manner and each physical processing unit being configured to process signal samples in accordance with a respective algorithm; a multiplicity of dynamic input/output interleavers, each dynamic input/output interleaver having an output line connected to an input line of a respective physical processing unit; a dynamic interleaving controller communicatively coupled to each dynamic input/output interleaver of the multiplicity of dynamic input/output interleavers and configured to receive signal information representing characteristics of received signals, including estimated bandwidth of the received signals, and to cause a virtual processing channel to be started on one or more physical processing units in accordance with a dynamic resource sharing algorithm that dynamically adjusts the interleaving sequence as new signal processing by newly received signals; an input channel block communicatively coupled to each dynamic input/output interleaver of the multiplicity of dynamic input/output interleavers and to each physical processing unit of the multiplicity of physical processing units; an output channel block communicatively coupled to each dynamic input/output interleaver of the multiplicity of dynamic input/output interleavers and to the dynamic interleaving controller; and a clock that outputs clock signals to the multiplicity of physical processing units, the multiplicity of dynamic input/output interleavers, the dynamic interleaving controller, the input channel block and the output channel block.

In accordance with one embodiment of the system described in the preceding paragraph, the dynamic interleaving controller is configured to use the signal information to look up in a circuit/algorithm table a processing circuit configured to process signal samples of a type characterized by the signal information, and send a virtual channel request to the multiplicity of dynamic input/output interleavers, which request includes data representing the estimated bandwidth of the received signals. Each dynamic input/output interleaver comprises an interleaving buffer and is configured to determine whether an empty slot exists in the interleaving buffer for a compatible interleaving period that meets bandwidth requirements or not and then send a message to the dynamic interleaving controller containing information representing a result of that determination. The dynamic interleaving controller is further configured to select from any dynamic input/output interleavers that have an empty slot a dynamic input/output interleaver with a smallest latency. The output channel block is configured to format an output vector that concatenates output from the dynamic input/output interleavers and the signal information representing characteristics of the received signals from the dynamic interleaving controller to form an information vector.

A further aspect of the subject matter disclosed below is a system for processing signals that vary in bandwidth, comprising: a transducer for converting received energy waves into a received signal in electrical form; a filter for passing a portion of the received signal having a frequency within a selected frequency bandwidth; a sampler comprising hardware or firmware configured to sample the received signal output by the filter to produce signal samples; a multiplicity of physical processing units, each physical processing unit comprising a respective multiplicity of processing circuits configured to process signal samples in a pipelined manner and each physical processing unit being configured to process signal samples in accordance with a respective algorithm; a multiplicity of dynamic input/output interleavers, each dynamic input/output interleaver having an output line connected to an input line of a respective physical processing unit; a dynamic interleaving controller communicatively coupled to each dynamic input/output interleaver of the multiplicity of dynamic input/output interleavers and configured to receive signal information representing characteristics of received signals, including estimated bandwidth of the received signals, and to cause a virtual processing channel to be started on a physical processing unit in accordance with a mapping between a virtual channel number and a processing circuit based on that signal information; an input channel block communicatively coupled to each dynamic input/output interleaver of the multiplicity of dynamic input/output interleavers and to each physical processing unit of the multiplicity of physical processing units; an output channel block communicatively coupled to each dynamic input/output interleaver of the multiplicity of dynamic input/output interleavers and to the dynamic interleaving controller; and a clock that outputs clock signals to the multiplicity of physical processing units, the multiplicity of dynamic input/output interleavers, the dynamic interleaving controller, the input channel block and the output channel block.

Other aspects of systems and methods for processing a multitude of various and varying signals in real time with low latency using fixed hardware with fixed processing resources are disclosed below.

BRIEF DESCRIPTION OF THE DRAWINGS

The features, functions and advantages discussed in the preceding section can be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
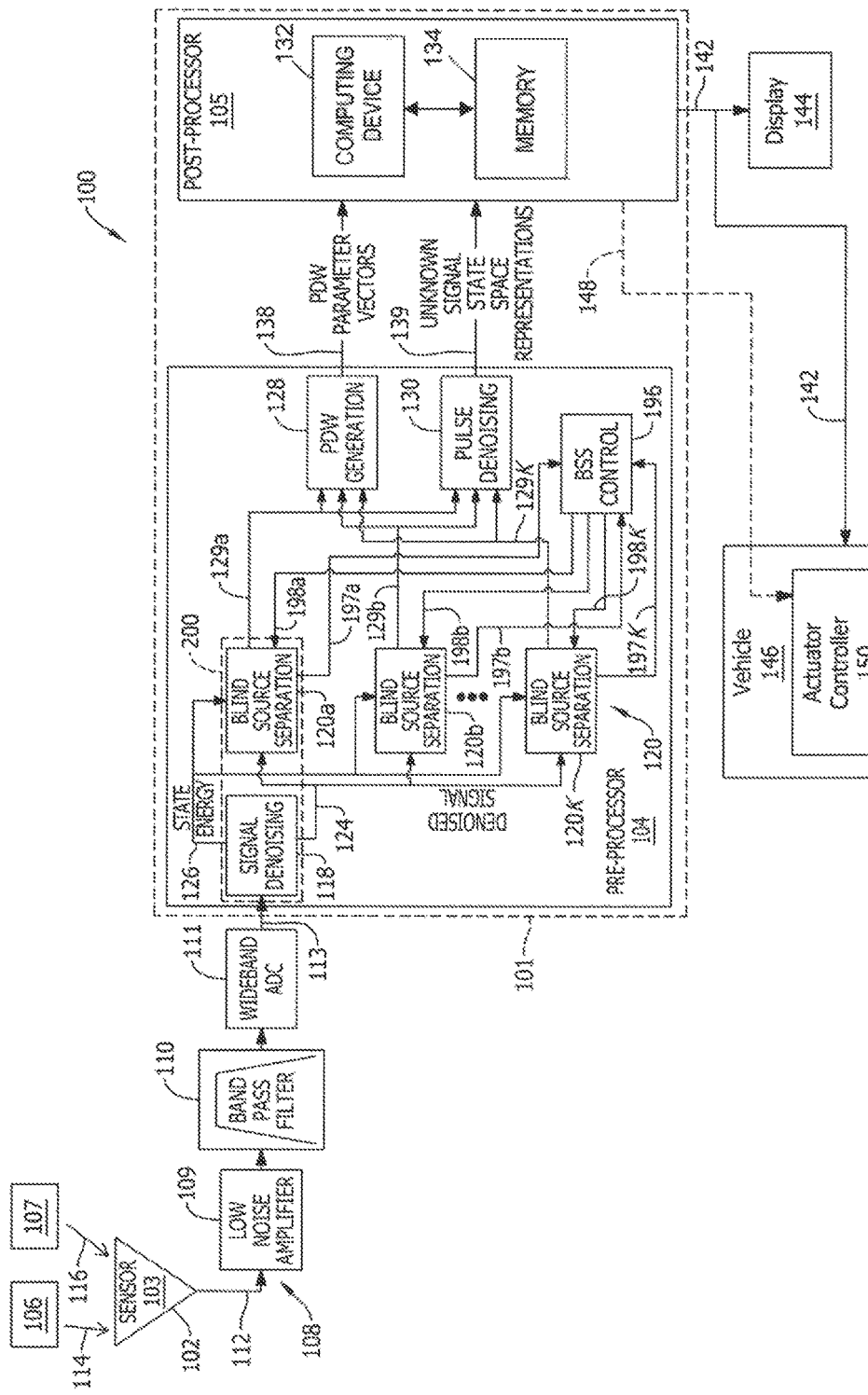
FIG. 1 is a block diagram showing a denoising and blind source separation architecture incorporated in a signal processing system for generating pulse descriptor words using blind source separation.

Illustrative embodiments of systems and methods for processing a multitude of various and varying signals in real time with low latency using fixed hardware with fixed processing resources are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and methodology disclosed below solves the difficult problem of interleaving signal processing on fixed computing resources with low latency and adjusting this interleaving in response to new signal conditions. This is accomplished using a dynamic interleaving signal processing architecture and a corresponding dynamic interleaving algorithm. The architecture and algorithm work together to control the processing of incoming signals that dynamically change over time without introducing excessive processing latency for these signals.

The system and methodology disclosed in some detail below is widely useful for signal processing systems with fixed processing resources that must adjust their processing to changing signal conditions. In particular, this system and methodology are applicable for signal descriptor word (SDW) generation that feeds the output from a wideband receiver.

A particular example of signal descriptor words is the pulse descriptor word (PDW) within a typical electronic warfare (EW) receiver. Such a receiver sees many radar signals of different types, such as frequency-modulated/continuous-wave or pulsed. These radar signals vary widely in bandwidth, pulse width and start times and hence they must be processed at rates commensurate with those bandwidths. Also, these radar signals come and go over time from moment to moment as new ones enter and old ones leave. The EW receiver must describe each signal properly and with very low latency. This is PDW generation.

Electronic warfare systems are receive-only systems that have front-end receivers that produce PDWs for each radar pulse they detect. They are unlike radar systems in that they do not naturally produce range and they must handle unknown signals rather than look for reflected versions of their transmitted signals. The digital versions of these receivers are typically designed as a filter bank; within each filter channel, radar pulses are separated from other coincident signals and have their noise decreased by the relative filter bandwidth compared to the total input bandwidth. These pulses with their increased signal-to-noise ratio (SNR) are processed to estimate PDW elements such as pulse width, frequency, time of arrival, bandwidth, and amplitude.

Systems are known in which PDWs are generated based on respective blind source separated signals output by tracking filters of a blind source separation system. Each PDW may contain data representative of signal characteristics of interest derived from a singular pulse of blind source separated signal, such as phase modulation parameters, frequency, bandwidth, time of arrival, time of departure, pulse width, pulse amplitude, pulse repetition interval, and/or angle of arrival.

For the sake of illustration, an embodiment will now be described that separates incoming radar pulses and then generates PDWs for use in controlling a vehicle. However, it should be appreciated that the blind source separation subsystem (hereinafter "BSS subsystem") disclosed herein may be used in applications other than vehicle control.

FIG. 1 is a block diagram identifying components of a signal processing system 100 for generating PDWs using blind source separation. Also known as blind signal separation, BSS subsystems and methods are employed for separation (i.e., filtering) of one or more source signals of interest from a plurality of mixed signals. In applications including, without limitation, an underdetermined case (i.e., fewer observed signals than signal sources), blind source separation facilitates filtering pure signals of interest from an arbitrary set of time-varying signals (e.g., radar pulses from one or more signal emitters) without relying on substantial amounts of known information about the source signals or the signal mixing process.

FIG. 1 shows an example BSS subsystem of an EW receiver. (Note that the techniques being described herein could also be used in a traditional channelizing receiver.) The BSS architecture shown in FIG. 1 includes a number of BSS channels 200 containing tunable filters (typically with center frequency and bandwidth as parameters), each of which produces a (presumed) unique separated denoised signal at its output. The maximum number of separated signals at any given time is limited by K, the total number of such BSS channels. The output of each channel is fed into a PDW generation module 128. The system depicted in FIG. 1 will now be described in some detail. Further details regarding this system are disclosed in U.S. patent application Ser. No. 15/296,233, the disclosure of which is incorporated by reference herein in its entirety.

In an exemplary implementation, signal processing system 100 includes a signal data processor 101 communicatively coupled to an antenna 102 by way of a pre-conditioner 108. Antenna 102, in the exemplary implementation, is embodied as a wide-area sensor 103. Signal data processor 101 includes a pre-processor 104 and a post-processor 105. Sensor 103 is configured to surveil at least one radar signal emitter (two radar signal emitters 106 and 107 are indicated). In one implementation, pre-conditioner 108 includes at least one electronic component (e.g., a low-noise amplifier 109, a band pass filter 110, and a wideband analog-to-digital converter (ADC) 111) configured to pre-condition a sensor output signal 112. In operation, pre-conditioner 108 is configured to convert a sensor output signal 112 received from sensor 103 into a conditioned signal 113 transmitted to pre-processor 104. Each conditioned signal 113 is derived from a time-varying signal received at sensor 103. Time-varying signals may include a mix of signals received from radar signal emitters 106 and 107. For example, time-varying signals may include a first radar signal 114 generated by radar signal emitter 106 or a second radar signal 116 generated by radar signal emitter 107, which signals are received by sensor 103.

In the exemplary embodiment, pre-processor 104 includes one or more signal denoising modules 118 and a plurality of BSS modules 120. Each BSS module 120 is coupled to a single signal denoising module 118 and represents one BSS channel 200. A total number of BSS channels 200 in signal processing system 100 is expressed as K. Signal denoising module 118 transmits a denoised signal 124 and a state energy signal 126 to each respective BSS module 120 (e.g., 120a, 120b, . . . , 120K) of the plurality of BSS modules 120. State energy signal 126 represents a quantity (e.g., an analog voltage level) that is proportional to the sum of the absolute value of an amplitude of incoming signal 113 squared at particular sampled time points (i.e., states).

In operation, incoming signal 113 is transmitted from pre-conditioner 108 to signal denoising module 118, where incoming signal 113 undergoes signal denoising and is subsequently transmitted as denoised signal 124 to each BSS module 120. For example, first radar signal 114 is initially received at sensor 103 as a pulse having signal characteristics including, without limitation, a frequency and a bandwidth. In this example, a single pulse of first radar signal 114, after processing by pre-conditioner 108, is then received at signal denoising module 118 as a mixed signal (i.e., the incoming signal 113 represents a signal pulse of the first radar signal 114 and has various characteristics including, without limitation, noise and information other than the desired information of interest). Signal denoising module 118 denoises the mixed incoming signal 113 prior to transmitting denoised signal 124 having a frequency and a bandwidth (or a regular pattern of frequencies and bandwidths) to the BSS modules 120. Methods implemented by signal processing system 100 are performed in substantially real time by the devices and systems described above.

Pre-processor 104 further includes a BSS control module 196 coupled to each BSS module 120. BSS control module 196 is configured to transmit a respective BSS control signal 198a through 198K to each of BSS modules 120. The plurality of BSS modules 120 connected to the BSS control module 196 will be referred to herein as the "BSS subsystem".

Further, in an exemplary implementation, pre-processor 104 comprises a PDW generation module 128 and a pulse denoising module 130, both of which are coupled to receive blind source separated signals 129 from a plurality of BSS modules 120 of the BSS subsystem. PDW generation module 128 generates PDW parameter vector signals 138 based on respective blind source separated signals 129 (e.g., 129a, 129b, 129K) received from the BSS modules 120 (e.g., 120a, 120b, . . . , 120K). Each PDW parameter vector signal 138 contains data representative of characteristics of interest of one of radar signals 114 and 116 derived from a singular pulse of blind source separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on blind source separated signals 129. Unknown signal state space representation signal 139 contains data representative of additional (e.g., non-PDW-type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105.

Signal denoising module 118, PDW generation module 128, and pulse denoising module 130 include suitable signal filtering, signal amplification, signal modulation, signal separation, signal conditioning, and/or ADC circuitry implemented using analog and/or digital electronic circuit components. Also, in the exemplary embodiment, each BSS module 120 (e.g., 120a, 120b, . . . , 120K) transmits a respective blind source separated signal 129 (e.g., 129a, 129b, . . . , 129K) to PDW generation module 128 and to pulse denoising module 130. Each BSS module 120 may be implemented in firmware or on a field-programmable gated array (FPGA) or in pure hardware in an application-specific integrated circuit (ASIC). Alternatively, each BSS module 120 may be implemented as software running on a processor.

Further, in an exemplary implementation, post-processor 105 comprises a computing device 132 and a memory 134. The memory 134 comprises one or more non-transitory tangible computer-readable storage media. Post-processor 105 is communicatively coupled to pre-processor 104. In accordance with one embodiment, the computing device 132 is a processor running software.

In accordance with some embodiments, the PDW generation module 128 is configured to receive a respective blind source separated signal 129 from each BSS module 120. PDW generation module 128 is further configured to transmit a PDW parameter vector signal 138 to post-processor 105. PDW parameter vector signal 138 received by computing device 132 is stored as computer-readable data in memory 134 including, without limitation, as at least one buffered data set.

In accordance with one implementation, the PDW generation module 128 will send each PDW to the computing system 132 as a PDW parameter vector signal 138 similar to (amplitude, time of arrival, center frequency, pulse width and bandwidth)=(amp, toa, cf, pw, bw). The PDW for each intercepted signal is stored in a pulse buffer for further processing by the computing system 132. As part of such processing, the PDWs are sorted and deinterleaved by clustering the incoming radar pulses into groups. In principle, each group should have characteristics representative of a single radar source or class of radar sources which allows that radar source or class to be identified. The identity of a particular signal is usually inferred by correlating the observed characteristics of that signal with characteristics stored in a list that also contains the identity of known radars. In addition to comprising a deinterleaver that identifies the radar emitter, the computing system 132 further comprises a geolocation engine for determining the coordinates of the location of the identified radar emitter.

In accordance with some embodiments, the pulse denoising module 130 is configured to receive blind source separated signals 129 from each BSS module 120. Pulse denoising module 130 is further configured to transmit an unknown signal state space representation signal 139 to post-processor 105. Unknown signal state space representation signal 139 received by computing device 132 is stored as computer-readable data in memory 134, including, without limitation, as at least one buffered data set. In an exemplary implementation, computing device 132 fetches buffered data sets from memory 134 for processing using a computer-based method employing an operating system running software executed from instruction set data also stored in memory 134.

The computing device 132 is configured to perform operations based on data contained in the PDW parameter vector signals 138 and unknown signal state space representation signals 139. Such operations include, without limitation, detecting, processing, quantifying, storing, and controlling a display device 144 for displaying (e.g., in human-readable data form) various characteristics of at least one of the radar signals 114 and 116 represented as data in the PDW parameter vector signals 138 and unknown signal state space representation signals 139. For example, a PDW parameter vector signal 138 generated by PDW generation module 128 may contain a plurality of PDW vector data blocks structured in a vector format, where each PDW vector data block contains one parameter of the first radar signal 114. Parameters representative of at least one characteristic of the first radar signal 114 contained in one PDW vector data block may include, without limitation, frequency, bandwidth, time of arrival, time of departure, pulse width, pulse amplitude, pulse repetition interval, and/or AOA. The computing device 132 is configured to read at least a portion of PDW parameter vector signal 138 and carries out at least one of the aforementioned operations on at least one PDW vector data block. Also, in an exemplary implementation, the computing device 132 is configured to read and separate (i.e., deinterleave) PDW parameter vector signal 138 into its constituent PDW vector data blocks, and store fewer PDW vector data blocks including, without limitation, at least one predetermined type of information, in memory 134 than the total number of PDW vector data blocks contained in PDW parameter vector signal 138. In other implementations, the computing device 132 is configured to read and separate all PDW vector data blocks from one another and store all data contained therein in memory 134. The computing device 132 can also be configured to facilitate the aforementioned operations substantially simultaneously (i.e., in real time) with receipt of at least one of the plurality of radar signals 114 and 116 by the sensor 103.

Resultant data from operations performed by the computing device 132 are stored in memory 134. Further, in the exemplary implementation, computing device 132 causes post-processor 105 to transmit a human-readable data signal 142 to a human machine interface to facilitate at least one of an interaction, a modification, a visualization, at least one further operation, and a viewable recording of information about at least one radar signal 114 and 116 by a user of signal processing system 100. The human machine interface may be, for example, a display device 144 which receives the human-readable data signal 142 from post-processor 105. In one example, characteristics of radar signal emitters 106 and 107 determined by signal processing system 100 are displayed on display device 144 as a map having a grid representative of a physical spatial domain including a surveillable space of sensor 103, where locations and identifying information of radar signal emitters 106 and 107 are displayed and plotted substantially in real time. The human-readable data signal 142 may also be transmitted from post-processor 105 to at least one device and/or system (e.g., an aerial or ground-based vehicle 146) associated with signal processing system 100. Further, the computing device 132 enables post-processor 105 to transmit, in substantially real time, an actuator control signal 148 to an actuator controller 150 included within vehicle 146 to direct or control movements thereof. For example, vehicle 146 may be a remotely and/or autonomously operated land vehicle or an unmanned aerial vehicle.

In operation, conditioned signal 113 is received by signal denoising module 118, where it undergoes signal denoising. The denoised signal 124 is transmitted to each BSS module 120. For example, first radar signal 114 may be transmitted to sensor 103 by first radar signal emitter 106 as a pulse having signal characteristics including, without limitation, a frequency (e.g., a center frequency) and a bandwidth. In this example, a single pulse of first radar signal 114 is received at signal denoising module 118 as a mixed signal (i.e., a signal pulse having various characteristics including, without limitation, noise and information other than the desired information of interest). Signal denoising module 118 denoises the mixed signal prior to transmitting a denoised signal 124 having a frequency and a bandwidth (or a regular pattern of frequencies and bandwidths). Methods implemented by signal processing system 100 are performed in substantially real time by the devices and systems described above.

In one mode of operation, at least one of frequency and bandwidth information contained in respective PDWs is plotted on a map on the display device 144 along with locations of respective radar signal emitters 106 and 107 to facilitate accurate tracking of locations and association with those particular radar signal emitters. In cases where at least one radar signal emitter is mobile, the map on display device 144 updates location information of at least one respective mobile radar signal emitter in substantially real time. Furthermore, the computing device 132 determines at least one of a velocity, an acceleration, a trajectory, and a track (i.e., including present and prior locations) of one or more mobile radar signal emitters (e.g., radar signal emitters 106 and 107). In another mode of operation, characteristics determined by signal data processing methods implemented by the signal data processor 101 may trigger a variety of substantially real-time physical actions in physical devices and systems in communication with the signal processing system 100. For example, characteristics of various radar signal emitters, including frequency and bandwidth determined by signal data processing methods implemented by signal processing system 100, may be transmitted in substantially real time as data to actuator controller 150 in vehicle 146 (e.g., rudders and flaps of a unmanned aerial vehicle) to direct movement or facilitate maneuvers thereof, for example, to avoid an area of operation of an unauthorized radar signal emitter determined to be a threat or to move toward the unauthorized emitter to eliminate the threat. As a further example, characteristics of radar signal emitters 106 and 107 determined by signal data processing methods described herein may be transmitted in substantially real time in a control signal to at least one of an electronic support measure (ESM) device and an EW system associated with signal processing system 100 to direct, for example, a radar jamming signal at a particular radar signal emitter operating in the surveillable environment of sensor 103 without authorization.

Each BSS module 120 in signal processing system 100 implements filtering methods with dynamic updating to generate high-quality PDWs containing at least one of amplitude, frequency, center frequency, bandwidth, pulse time of arrival, and pulse width information. Such improved accuracy and resolution of PDWs to track, for example, frequency and bandwidth of, for example, individual radar signals facilitates at least one of identifying, determining, and analyzing at least one radar signal emitter from which associated radar signals are emitted. For example, information including, without limitation, information derived from PDWs from at least one of the radar signal emitters 106 and 107 may be displayed on display device 144 after being transmitted thereto by post-processor 105 as human-readable data signal 142, as described above. This enhanced information enables signal processing system 100 to distinguish first radar signal emitter 106 from second radar signal emitter 107. Also, for example, different radar signal emitters in a surveilled environment of sensor 103 may be plotted at respective locations (i.e., grid coordinates) on display device 144 (i.e., as a map).

Also, in operation, each BSS module 120 separates a respective denoised signal 124. Each BSS module 120 contains a plurality of tunable filters, wherein each filter operates in accordance with filter parameters that include, without limitation, a center frequency and a bandwidth. Further, in the exemplary embodiment, pre-processor 104 includes a BSS control module 196, which facilitates controlling BSS modules 120. BSS control module 196 receives respective BSS data signals 197 (e.g., 197a, 197b, . . . , 197K) containing BSS-related information including, without limitation, frequency, bandwidth, and state, from each BSS module 120. Based on the BSS-related information contained in BSS data signals 197, BSS control module 196 also generates and transmits respective BSS control signals 198 (e.g., 198a, 198b, . . . , 198K) back to each respective BSS module 120 to control, for example and without limitation, a timing of receipt of denoised signal 124 and transmission of respective blind source separated signals 129 to at least one of PDW generation module 128 and pulse denoising module 130. Information contained in BSS data signals 197 and BSS control signals 198 is used by BSS control module 196 to facilitate implementation of a feedback control loop. The BSS control module 196 is further configured to tune (i.e., update) the center frequency and bandwidth of each filter of the plurality of filters in each BSS module 120 to enable radar signals which fall within the input bandwidth to be separated out in consistent BSS channels. BSS control module 196 also implements scheduling of fixed filter resources in each BSS module 120, which facilitates separation of denoised signals 124 with as few missed signals as possible given the filter resources available.

In accordance with one embodiment, BSS control module 196 comprises a processor running software. All of the other modules inside pre-processor 104 can be implemented in a processor running software or in firmware on an FPGA or in pure hardware in an ASIC. And these could be mixed, some in hardware and some in software. However, the most reasonable implementation would be in hardware or in an FPGA for the other modules inside the pre-processor 104.

The aforementioned filtering methods enable signal processing system 100 to generate high-quality PDW parameter vector signals 138 that are used for identifying, determining, and analyzing radar signal emitters 106 and 107. For example, PDW parameter vector signals 138 associated with radar signal emitter 106 are displayed on display 144, as described above. Also, for example, improved information about frequencies and/or bandwidths contained in at least two PDW parameter vector signals 138 enable signal processing system 100 to distinguish first radar signal emitter 106 from second radar signal emitter 107. These radar signal emitters 106 and 107 are plotted at respective locations on display 144 (e.g., as a map).

The present disclosure is directed toward improvements in the above-described PDW generation module 128, which takes all the separated signals from each BSS channel and produces PDW parameter vectors using a set of fixed hardware resources. The circuitry disclosed in some detail below allows the PDW processing to be shared among a small number of computing resources, instead of using a large amount of dedicated resources that are underused. That circuitry also allows the PDW processing to have low (and controlled) latency, which is important for EW systems.

When mapping processing of many streams of real-time data to on-chip resources, such as would be available in an ASIC or FPGA, it must be done in an efficient way that uses very little hardware and introduces no essentially new processing latency. This is made difficult due to the fact that the simplest mapping is the most inefficient. This mapping would simply process each stream of data at the same full processing rate for all signals. This is inefficient because different signals have different bandwidths and signals typically only need to be processed at their own bandwidth. Two problems would occur. High rate channels would be processing low rate signals and so would be mostly idle and under-used. Also, a very high rate signal would have to be dropped if no channel that supported that rate were created. Such dedicated processing would also require a full set of separate hardware for each data stream, which may be impossible depending on the number of such data streams. Note that another way to accomplish the processing of multiple signals is to buffer all the signals and process each one sequentially at their required bandwidth. While this is much more efficient in terms of processing, it introduces unacceptable delays (or latency) in the processing since buffered signals would have much longer delays. Also, buffering introduces a requirement on having a great deal of high-speed memory capacity, which may not be possible to meet. Note also that system requirements for real-time signal processing typically cannot introduce significant delays, because actions must be taken on the signals in real time.

The circuitry and methodology proposed herein provides a way to map the signal processing onto fixed hardware resources efficiently and still preserve essentially the same low latency that full rate processing would achieve. The design and implementation of the proposed system comprises: (1) a hardware architecture that implements dynamic interleaving of signal processing; and (2) a dynamic resource sharing algorithm that dynamically adjusts the interleaving sequence as new signal processing is required by newly detected signals. In the following paragraphs, first a dynamic interleaved signal processing architecture for the PDW generation circuitry is described. Then a corresponding dynamic interleaving algorithm is described that can make use of this dynamic interleaving architecture.

Figure 2:
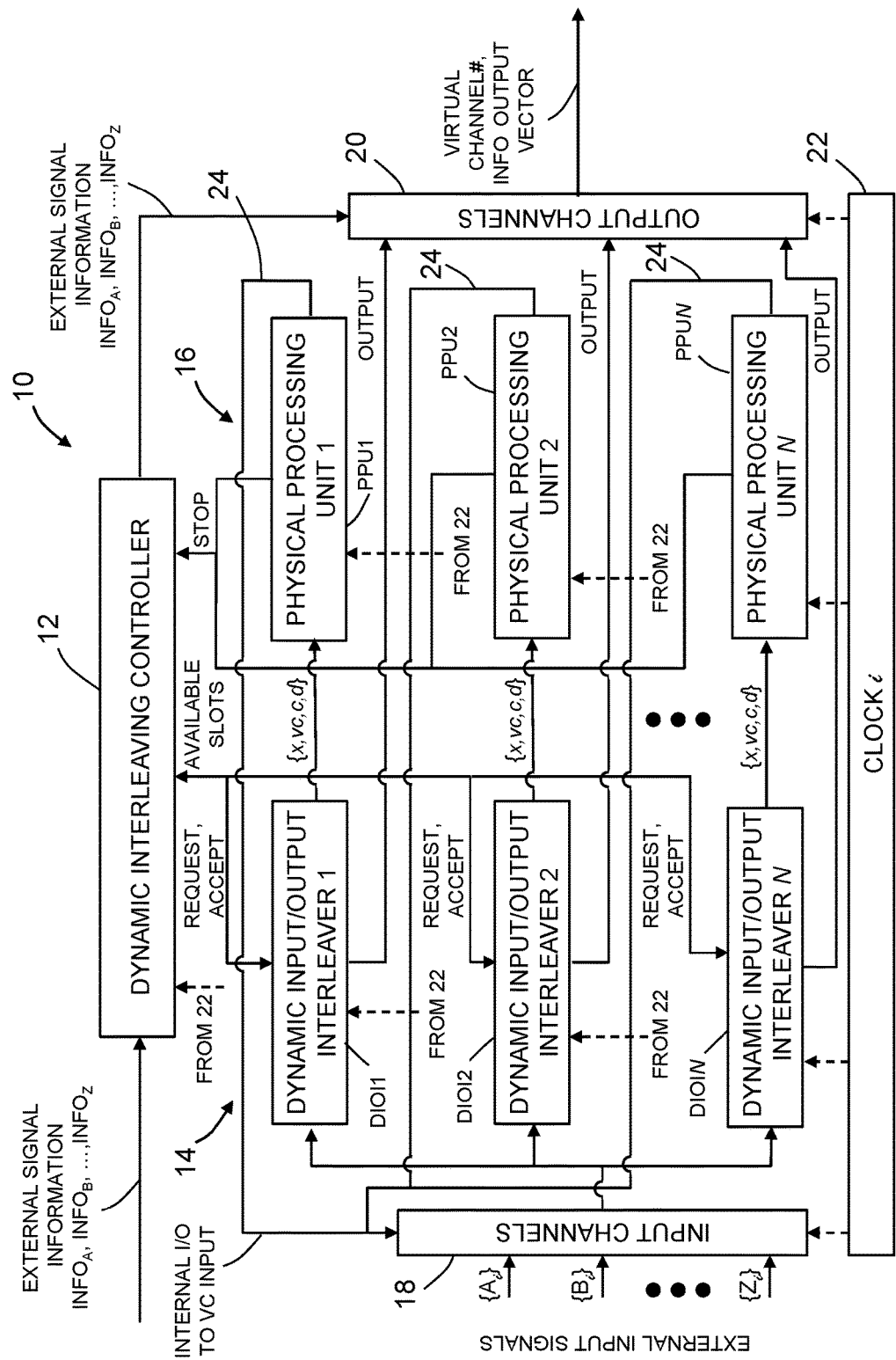
FIG. 2 is a block diagram showing a dynamic interleaving architecture for processing various and varying signals in real time with low latency, which architecture may be incorporated in the receiver of a system having the architecture depicted in FIG. 1.

FIG. 2 is a block diagram showing an architecture of a dynamic interleaving processing system 10 for processing various and varying signals in real time with low latency, which architecture may be incorporated in the receiver of a system having the architecture depicted in FIG. 1. This dynamic interleaving architecture allows mapping a common series of processing steps to common physical hardware with the use of interleaving (or multiplexing) to do essentially parallel processing of data streams on common hardware. The three main types of processing blocks are: (A) a dynamic interleaving controller 12; (B) a multiplicity of N dynamic input/output interleavers 14 (respectively designated DIOI1, DIOI2, . . . , DIOIN in FIG. 2); and (C) a multiplicity of N physical processing units 16 (respectively designated PPU1, PPU2, . . . , PPUN in FIG. 2). The architecture 10 depicted in FIG. 2 further comprises: (D) an input channel block 18; and (E) an output channel block 20. These blocks are briefly described with reference to FIG. 2 in the next five paragraphs. All of these components receive clock signals (indicated by dashed arrows in FIG. 2) from a clock 22, which enables their operations to be coordinated.

(A) Dynamic Interleaving Controller—The dynamic interleaving controller 12 takes as input new external signal information $INFO_A$, $INFO_B$, . . . , $INFO_Z$ (corresponding to external input signals $\{A_i\}$, $\{B_i\}$, . . . $\{Z_i\}$), including the signal's estimated bandwidth, and causes a new virtual processing channel vc to be started on one or more of the physical processing units PPU1 to PPUN of the multiplicity of physical processing units 16. More specifically, the dynamic interleaving controller 12 sends virtual channel requests to all unselected (i.e., non-picked) dynamic input/output interleavers 14 via a bus 15. The time between the notification and start of processing is able to be implemented in a very few number of clock periods, hence reducing overall latency. There is an agreed-to mapping between the virtual channel number vc and the actual physical circuitry within each physical processing unit. Thus the dynamic interleaving controller 12 can map the correct signal to the correct algorithm through this agreed-to mapping. The operation of the dynamic interleaving controller 12 is explained in more detail below.

(B) Dynamic Input/Output Interleaver—Each dynamic input/output interleaver DIOI1 to DIOIN of the multiplicity of N dynamic input/output interleavers 14 has an interleaving buffer 72 (see FIG. 4) of size N which stores data $I_i$ identifying the input channel, data $O_i$ identifying the output channel, data $d_i$ representing the period, data $vc_i$ identifying the virtual channel, and data $c_i$ identifying the circuit which are to be processed on the i-th clock period, where i=0, 1, 2, . . . , N−1. The interleaving buffer 72 can hold P samples (i.e., has P slots). The main function of the interleaving buffer 72 is to take a sample of input data $x_i$ on the i-th clock period and pass this sample to either its associated physical processing unit along with the virtual channel number $vc_i$ and period $d_i$ from its memory or to an output channel. There is an agreed-to mapping between the circuit number $c_i$ and the actual physical circuitry within the physical processing unit. Each dynamic input/output interleaver DIOI1 to DIOIN is also able to take a bandwidth value bw from the external signal information received by the dynamic interleaving controller 12 and either find empty slots in its memory for a compatible interleaving period that meets the bandwidth requirements or report that none is available. Finally, each dynamic input/output interleaver DIOI1 to DIOIN is also able to place the input, output, period, virtual channel and circuit information into these unused slots of the interleaving buffer 72 under control of commands from the dynamic interleaving controller 12. The dynamic input/output interleavers 14 receive virtual channel requests and acceptances from the dynamic interleaving controller 12 and send messages regarding slot availability to the dynamic interleaving controller 12 via bus 15. The operation of the dynamic input/output interleaver is described in more detail below.

(C) Physical Processing Unit—The physical processing units PPU1 to PPUN of the multiplicity of N physical processing units 16 process the signals of each input sample x with sample period d using circuit c and virtual channel vc. Typically each sample proceeds through a physical processing circuit in a pipelined fashion, where the pipeline consists only of input samples associated with this virtual channel. Thus the physical processing unit switches which channel is currently processing as often as once per clock. This switch involves sharing some of the same arithmetic and logic circuitry, while using separate memory elements. Thus common circuits are reused, but distinct memory for each virtual channel is typically required. Each virtual channel then produces a periodic output sample that is sent to the input channel block 18 at virtual channel vc. The physical processing units PPU1 to PPUN also produce a signal (STOP (vc#)) back to the dynamic interleaving controller 12 on bus 17 when the current virtual channel processing is complete. The operation of the physical processing unit is described in more detail below.

(D) Input Channel—The input channel block 18 takes signals from two sources, external and internal. The external input signals $\{A_i\}$, $\{B_i\}$, . . . , $\{Z_i\}$ represent sampled signal values for each clock signal i output by clock 22. Each such external input is temporarily stored in its own first-in/first-out (FIFO) buffer (not shown in FIG. 2) in the input channel block 18. Similarly, the internal signals that are the N outputs on lines 24 from the multiplicity of physical processing units PPU1 to PPUN are fed back to the input channel block 18 via the line labeled "INTERNAL I/O TO vc INPUT" in FIG. 2 and are each temporarily stored in respective FIFO buffers. The set of 2N such FIFO buffer outputs provides 2N inputs into a 2N input/N output selector (not shown in FIG. 2) that is controlled by the N dynamic input/output interleavers DIOI1 to DIOIN. Each dynamic input/output interleaver selects which of the 2N inputs go into its input on clock i using the selector.

(E) Output Channel—The output channel block 20 takes as input the output from the multiplicity of N dynamic input/output interleavers 14 and the external signal information output from the dynamic interleaving controller 12. Its function is to join this information together correctly and output it to external systems (in the case of an EW receiver, this information would go to a deinterleaver, but in general it would go to the external system that consumes the information that has been produced; see, e.g., post-processor 105 in FIG. 1). The external signal information would go into a content-addressable memory element in the output channel block 20 indexed by the virtual circuit (vc) associated with each external signal. (As used herein, the term "content-addressable memory" refers to a special type of computer memory that compares input search data (tag) against a table of stored data, and returns the address of matching data.) This external signal information would be sent to the output channel block 20 by the dynamic interleaving controller 12 when the decision is made to start processing each external signal {A, B, . . . , Z}. Thus, it arrives ahead of the processed output from each dynamic input/output interleaver DIOI1 to DIOIN. The output channel block 20 then takes the vc label associated with each output value on each clock i and looks up the correct external signal information and formats an output vector that concatenates these together to form the output vector (e.g., a PDW parameter vector) of the output channel block 20.

The basic processing sequence as shown in FIG. 2 is as follows. External signals come into this dynamic interleaving processing system 10 from various sources into the input channel block 18, which simply provides buffering and selection of such digital signal samples to be distributed to the physical processing units PPU1 to PPUN by the dynamic input/output interleavers DIOI1 to DIOIN. Also, the outputs of the various physical processing units PPU1 to PPUN go into the input channel block 18 to be distributed among the physical processing units PPU1 to PPUN by the dynamic input/output interleavers DIOI1 to DIOIN as well, in order to continue processing with the same or a different sample period. The other option for each dynamic input/output interleaver DIOI1 to DIOIN is to send this input channel result to the output channel block 20 when processing is completed on the respective virtual channel. Another external input is the new signal information input (along with estimated bandwidth) that goes into the dynamic interleaving controller 12 and initiates the processing of new signals. External output is handled by the output channel block 20, which provides buffering and sequential streaming of results of processing each such virtual channel. An overall global clock 22 controls this entire process.

Figure 3:
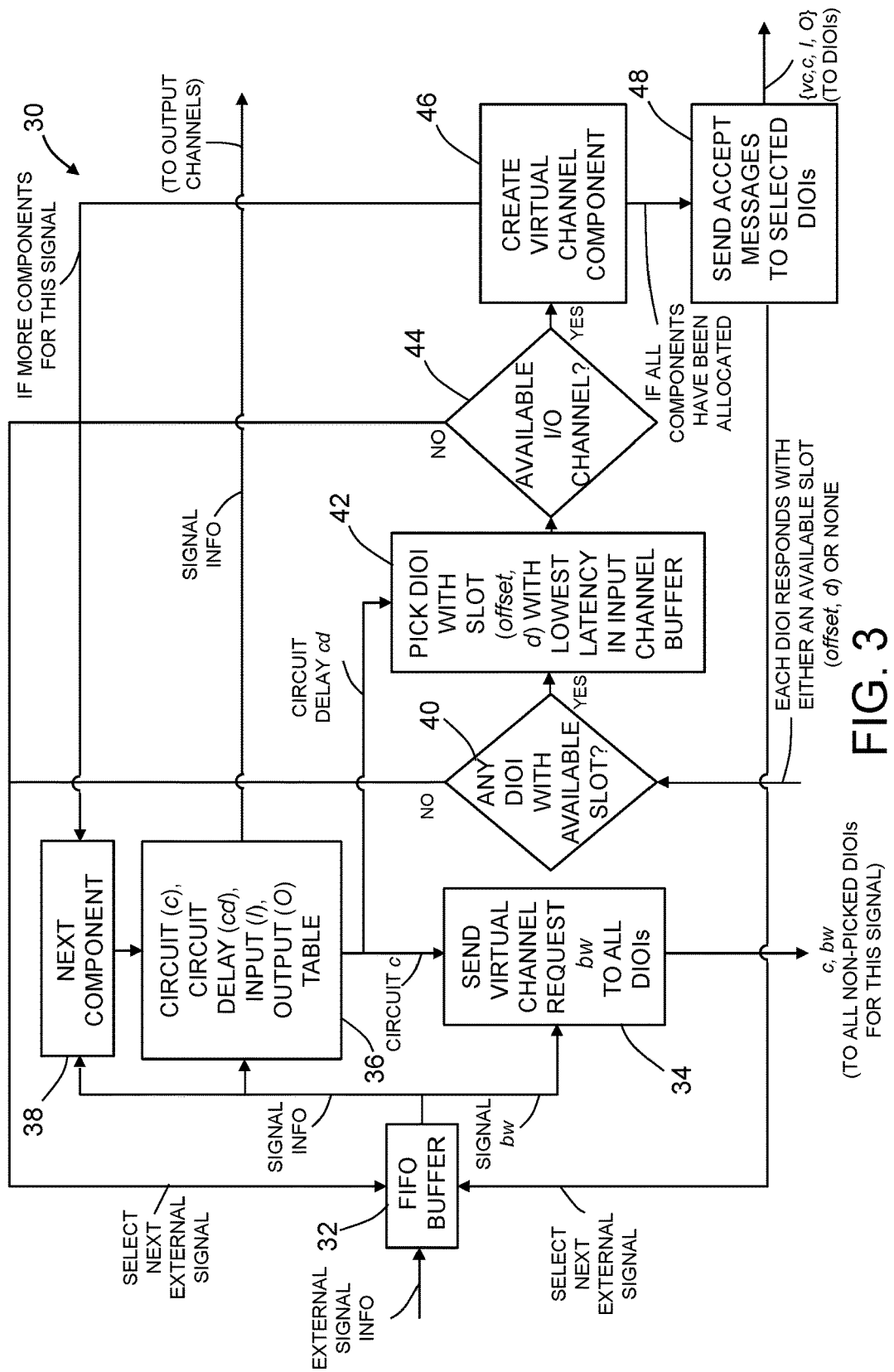
FIG. 3 is a flowchart identifying steps of a method for dynamic interleaving control in accordance with at least one embodiment of the dynamic interleaving architecture depicted in FIG. 2.

FIG. 3 is a flowchart identifying steps of a method 30 for dynamic interleaving control in accordance with at least one embodiment of the dynamic interleaving architecture depicted in FIG. 2. More specifically, FIG. 3 shows the details of how the dynamic interleaving controller 12 creates and starts virtual channel processing on a particular physical processing unit through its corresponding dynamic input/output interleaver. The dynamic interleaving controller 12 comprises a FIFO buffer 32 and a processor (not shown in FIG. 3). The processor of the dynamic interleaving controller 12 is configured (e.g., programmed) to control execution of the steps of method 30 as follows:

(a) A new external signal is detected from the receiver and new external signal information (including bandwidth and other application specific information such as frequency, time, etc.) is sent to the dynamic interleaving controller 12 to be buffered by FIFO buffer 32.

(b) When a request comes in to select the next external signal, the FIFO buffer 32 sends the signal information to a circuit/algorithm table 36. This signal information is used to look up an existing circuit (or sequence of circuits) designed to process that particular type of signal based on its information and current component (this is purely application specific and the details are independent of this disclosure).

(c) In addition, the signal's estimated bandwidth (bw) is sent to a block 34 which sends virtual channel requests to all unselected (i.e., non-picked) dynamic input/output interleavers for this signal. More specifically, the block 34 sends data representing the bandwidth bw received from the FIFO buffer 32 and the circuit c received from circuit/algorithm table 36.

(d) Each dynamic input/output interleaver will respond with either a "no available slot" message or an available slot list (offset; d) meeting the requirements of the virtual channel, where offset is the number of slots that a particular slot is offset from slot 0 and d is the time interval (i.e., number of clocks) separating the start of two slots occupied by successive signal samples. These responses are received by dynamic interleaving controller 12.

(e) The dynamic interleaving controller 12 will then determine whether there is at least one available slot in one dynamic input/output interleaver or not (operation 40 in FIG. 3), i.e., none available. If none are available, the dynamic interleaving controller 12 will process the next external signal. If at least one slot is available, the dynamic interleaving controller 12 will select (i.e., pick) the dynamic input/output interleaver with the smallest latency based on the circuit delay and available slot list location (operation 42 in FIG. 3).

(f) The dynamic interleaving controller 12 will then determine whether there is an input channel available. If there is an available virtual channel (vc) to send the output, a new virtual channel component will be created (operation 46 in FIG. 3). If other components (e.g., next component 38 in FIG. 3) are needed (based on the original signal information, stored circuits and other application-specific needs), the previous four steps will be redone for each of those components.

(g) Finally, if all components have been allocated, then the dynamic interleaving controller 12 sends an accept message to all of the selected dynamic input/output interleavers (DIOIs) with the virtual channel information for each (operation 48 in FIG. 3).

Figure 4:
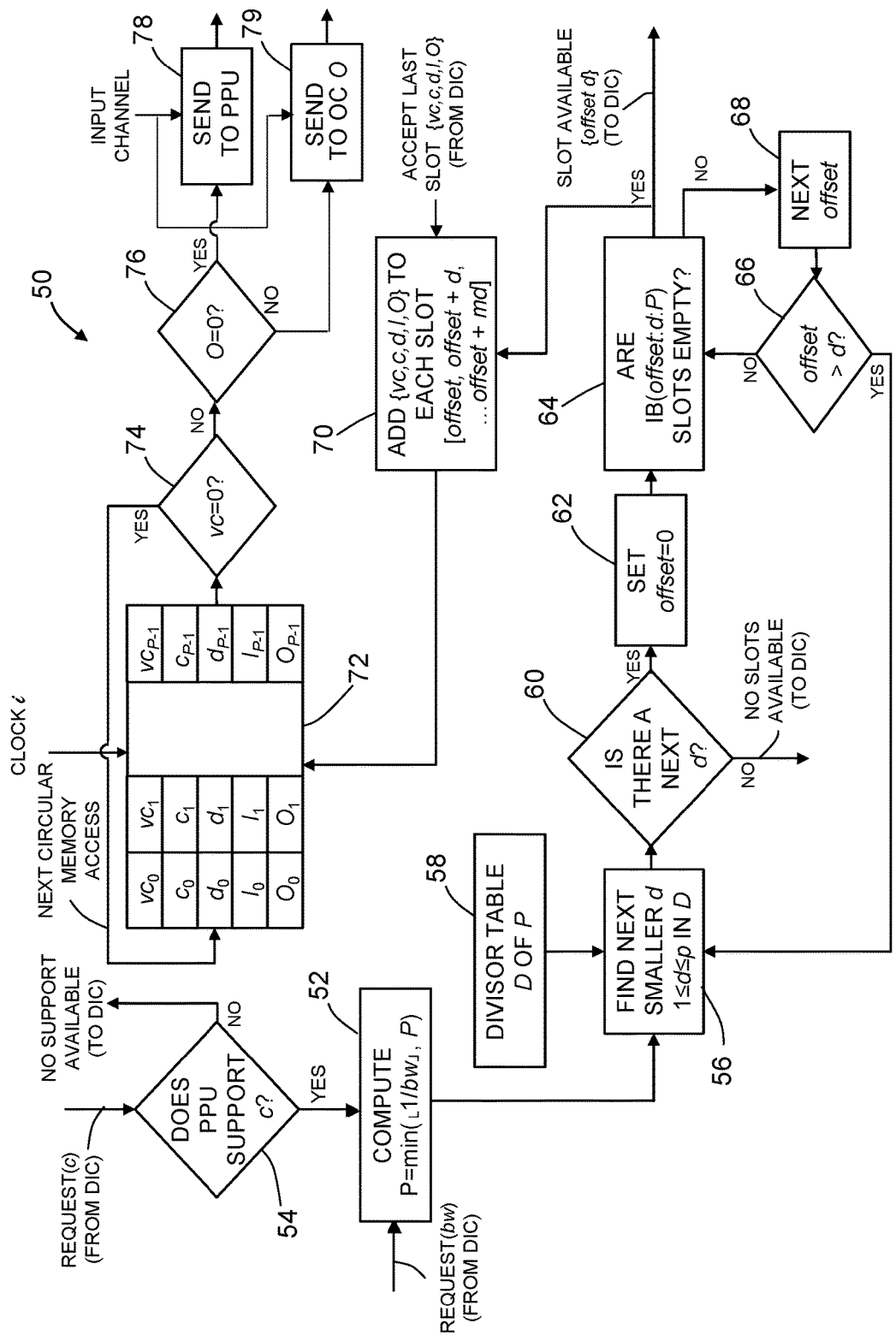
FIG. 4 is a flowchart identifying steps of a method for dynamic input/output interleaving in accordance with at least one embodiment of the dynamic interleaving architecture depicted in FIG. 2.

FIG. 4 is a flowchart identifying steps of a method 50 for dynamic input/output interleaving in accordance with at least one embodiment of the dynamic interleaving architecture depicted in FIG. 2. More specifically, FIG. 4 shows the details of how each of the dynamic input/output interleavers DIOI1 to DIOIN sets up its interleaving buffer 72 and interleaves data with its associated virtual channel information as input to an associated physical processing unit. Each of the multiplicity of N dynamic input/output interleavers 14 comprises a respective processor (not shown in FIG. 4) and a respective interleaving buffer 72. Preferably the interleaving buffer 72 is in the form of a circular memory.

The normal operation of each processor when interleaving data is to take the j=i mod P indexed vector in the interleaving buffer 72 (where P is the buffer length) on the i-th clock period if vc≠0 (decision block 74 in FIG. 4) and send the data value $x_{I(j)}(i)$ along with vc(j), CU) and d(j) to the associated physical processing unit (step 78 in FIG. 4) if $O_j=0$ (determined in decision block 76 in FIG. 4) or send the same data values to its output channel $O_j$ (step 79) (e.g., as the components of a PDW parameter vector) if a determination is made in decision block 76 that $O_j \neq 0$. This executes on each clock signal i. Note that if a determination is made in decision block 74 that vc=0, nothing is output, since this denotes an empty slot, in which case method 50 proceeds to the next circular memory access.

The other operation performed by the processor within each dynamic input/output interleaver is a process to update its interleaving buffer 72 through requests from the dynamic interleaving controller 12 (referred to by the acronym "DIC" in FIG. 4) for new virtual channels. The steps in this process are as follows:

(a) A request for circuit c with bandwidth bw comes from the dynamic interleaving controller 12.

(b) The DIOI processor determines whether its associated physical processing unit supports circuit c or not (decision block 54 in FIG. 4). If no support is available, then a message indicating that state is returned to the dynamic interleaving controller 12. If support is available, then the DIOI processor computes p=min($\lfloor 1/bw \rfloor$, P) (step 52 in FIG. 4), where the "floor" symbol denotes the largest integer smaller than 1/bw.

(c) Next, a divisor table 58 (i.e., divisor table D of P) is used to find the largest divisor d less than or equal to p and in subsequent calls to find ever smaller ones (step 56 in FIG. 4). The divisor table 58 contains data representing buffer lengths P and their associated periods based on the divisors of the length. The buffer length P is typically chosen as a highly composite number (many divisors) to meet particular system needs for a wide variety of processing periods.

(d) A determination is then made in decision block 60 whether a next divisor d is possible or not. If a determination is made in decision block 60 that there is no next divisor d, then a no slot available message is sent back to the dynamic interleaving controller 12.

(e) If a determination is made in decision block 60 that a next divisor d is possible, then the offset is reset to zero (i.e., offset=0) in step 62 and a list of interleave buffer (IB) slots (i.e., the slots in interleaving buffer 72) is examined (decision block 64 in FIG. 4). This slot list consists of {offset, offset+d, offset+2d, . . . , offset+md}. (This list is denoted in FIG. 4 as (offset:d:P), where the last value is the largest value in this arithmetic sequence that is ≤P.)

(f) If a determination is made in decision block 64 that all slots in the interleaving buffer are empty, a slot available message is sent back to the dynamic interleaving controller 12. When the dynamic interleaving controller 12 responds with an accept message with the details of the virtual channel {vc; c; d; I; O}, this information is stored in the interleaving buffer 72 (step 70 in FIG. 4).

(g) If a determination is made in decision block 64 that not all slots are empty, the offset value is incremented (step 66) and then a determination is made whether offset>d or not (decision block 66 in FIG. 4).

(h) If a determination is made in decision block 66 that the offset value is not greater than d, then the process returns to decision block 64.

(i) If a determination is made in decision block 66 that the offset value is greater than d (i.e., if no slots are available for all offset values less than d) then the next smaller d is selected (step 56) and the process steps described in paragraphs (d) through (g) are repeated. As previously mentioned, if no value of d works, a no slot available message is sent back to the dynamic interleaving controller 12 (see step 60 in FIG. 4).

Figure 5:
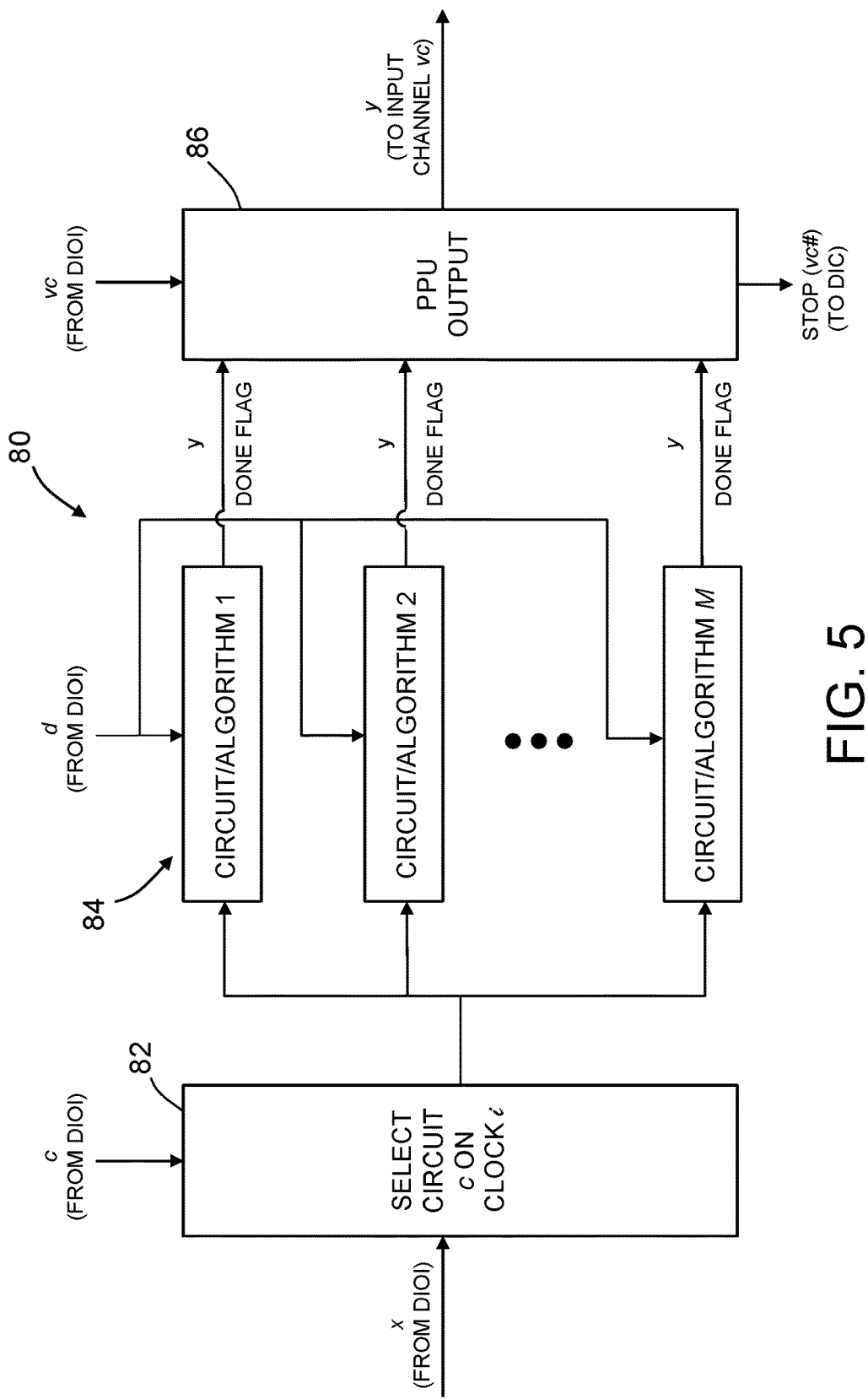
FIG. 5 is a block diagram identifying at least some components of a physical processing unit in accordance with at least one embodiment of the dynamic interleaving architecture depicted in FIG. 2.

FIG. 5 is a block diagram identifying at least some components of a physical processing unit 80 in accordance with at least one embodiment of the dynamic interleaving architecture depicted in FIG. 2. The physical processing unit 80 comprises a selector 82, a multiplicity of M processing circuits (hereinafter "processing circuitry 84") which process input signals in accordance with respective algorithms, and an output block 86. The selector receives samples of input data x and data representing the circuit c to be employed from the associated dynamic input/output interleaver (DIOI). The physical processing unit 80 selects which of the inputs go into which processing circuit on each clock i using the selector 82. The processing circuitry 84 receives data representing the period d from the associated dynamic input/output interleaver. The output block 86 receives data representing the virtual channel vc from the associated dynamic input/output interleaver.

The physical processing unit 80 processes the signals of each input sample x with sample period d using circuit c and virtual channel vc. Typically each sample proceeds through physical processing circuit 80 in a pipelined fashion, where the pipeline consists only of input samples associated with this virtual channel. Thus the physical processing unit 80 switches which channel is currently processing as often as once per clock.

More specifically, the physical processing unit 80 contains processing circuitry 84 designed to process the signal samples using desired algorithms. The samples flow circularly through one circuit of processing circuitry 84, back to an input channel vc, through the associated dynamic input/output interleaver, and then through the next circuit of processing circuitry 84. Each circuit of processing circuitry 84 may perform a different mathematical computation (e.g., accumulate, multiply, etc.) that is part of the selected algorithm. Each time the dynamic input/output interleaver instructs the associated physical processing unit 80 which circuit c of processing circuitry 84 to use and also sends data representing the period d to each circuit of the processing circuitry 84.

The processing circuitry 84 may be completely different for different applications. Each circuit of processing circuitry 84 can stream data through on any given clock period offset and the circuit algorithm is parameterized by this clock period p. This parameterization enables processing to be done differently depending on the estimated bandwidth of the signal. Typically, this often means that the value p is used to select the correct coefficients for the particular algorithm as implemented in the circuit on the current clock.

The system and methodology uses interleaving to dynamically process signal samples. The approach disclosed above will allow many different kinds of processing to take place. Two examples are the following:

(a) A common processing algorithm is a decimating low-pass filter. This is supported in the method disclosed above by allowing efficient implementation of this algorithm through the ability to select coefficients for the particular period being processed with a common multiplier-adder pipeline.

(b) Finding the energy of different subsequences of a signal over a sliding window can similarly be handled easily by allowing the switching of the virtual channel to change the sliding window used in this algorithm as the hardware switches between virtual channels.

A method has been described for mapping signal processing of multiple diverse and dynamically changing signals to a set of fixed hardware on either an FPGA or ASIC. This method has the following features: (1) efficient mapping of signal processing of incoming signals onto a fixed set of existing FPGA or ASIC processing resources; (2) the ability to dynamically change mapping of processing to hardware as the incoming signal characteristics change; (3) the ability to control processing latency of all the incoming signals; and (4) an architecture that allows this dynamic remapping/interleaving of signals and algorithms using the concepts of dynamic input/output interleavers and virtual signal processing elements. These features provide benefits, including processing a fixed set of signals using less hardware more efficiently and also dynamically adjusting the processing to handle new signal conditions without increasing the amount of hardware required.

Certain systems, apparatus, applications or processes are described herein as including a number of modules. A module may be a unit of distinct functionality that may be implemented in software, hardware, or combinations thereof, except for those portions of the PDW generation module 128 which are hardware or firmware to enable streaming calculations as disclosed herein. When the functionality of a module is performed in any part through software, the module can include a non-transitory tangible computer-readable storage medium. The modules may be regarded as being communicatively coupled.

While systems and methods have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms "processor" and "computing device".

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A method for processing signals that vary in bandwidth using a set of fixed hardware resources, the method comprising:
    (a) sampling a received signal having a frequency within a specified bandwidth to produce signal samples;
    (b) generating signal information representing characteristics of the received signals, including estimated bandwidth of the received signals;
    (c) mapping signal processing of the received signal samples onto a fixed set of processing circuitry in accordance with an interleaving scheme, wherein the mapping is dynamically changed by a dynamic interleaving controller as the characteristics of the received signals change;
    (d) interleaving signal processing of the received signal samples by the processing circuitry in accordance with the mapping;
    (e) generating information vectors comprising respective data sets of parameter values of received signals; and
    (f) storing the data sets of parameter values of the information vectors in a non-transitory tangible computer-readable storage medium.

2. The method as recited in claim 1, further comprising:
    identifying a signal emitter based on the stored data sets of parameter values;
    locating the signal emitter; and
    sending control signals to an actuator controller of a vehicle, which control signals direct a movement of the vehicle based on a location of the signal emitter.

3. The method as recited in claim 1, wherein the mapping maps virtual channel numbers to respective circuits of the processing circuitry.

4. The method as recited in claim 3, wherein step (c) comprises using the signal information to look up in a circuit/algorithm table a circuit or sequence of circuits of the processing circuitry designed to process signal samples of a type based on the signal information.

5. The method as recited in claim 4, wherein step (c) further comprises sending a virtual channel request to a multiplicity of dynamic input/output interleavers, which request includes data representing the estimated bandwidth of the received signals.

6. The method as recited in claim 5, wherein step (c) further comprises determining in each dynamic input/output interleaver whether an empty slot exists for a compatible interleaving period that meets bandwidth requirements or not.

7. The method as recited in claim 6, wherein determining whether an empty slot exists comprises finding empty slots in a respective interleaving buffer in each dynamic input/output interleaver, wherein the interleaving buffer stores data identifying an input channel, an output channel, a period, a virtual channel and a circuit of the processing circuitry associated with each dynamic input/output interleaver.

8. The method as recited in claim 7, wherein step (c) further comprises selecting from any dynamic input/output interleavers that have an empty slot a dynamic input/output interleaver with a smallest latency.

9. The method as recited in claim 7, wherein step (d) comprises setting up an interleaving buffer in a dynamic input/output interleaver and interleaving data with an associated virtual channel number as input to an associated circuit of the processing circuitry.

10. The method as recited in claim 3, wherein samples proceed through a circuit of the processing circuitry in a pipelined fashion, wherein the pipeline comprises only samples associated with the virtual channel that the circuit is part of.

11. The method as recited in claim 9, wherein the processing circuitry produces a signal when current virtual channel processing is complete.

12. The method as recited in claim 11, wherein step (e) comprises formatting an output vector that concatenates output from the dynamic input/output interleavers and the signal information representing characteristics of the received signals to form an information vector.

13. The method as recited in claim 12, wherein the information vector comprises data representing a pulse descriptor word.

14. A system for processing signals that vary in bandwidth, comprising:
    a transducer for converting received energy waves into a received signal in electrical form;
    a filter for passing a portion of the received signal having a frequency within a selected frequency bandwidth;
    a sampler comprising hardware or firmware configured to sample the received signal output by the filter to produce signal samples;
    a multiplicity of physical processing units, each physical processing unit comprising a respective multiplicity of processing circuits configured to process signal samples in a pipelined manner and each physical processing unit being configured to process signal samples in accordance with a respective algorithm;
    a multiplicity of dynamic input/output interleavers, each dynamic input/output interleaver having an output line connected to an input line of a respective physical processing unit;
    a dynamic interleaving controller communicatively coupled to each dynamic input/output interleaver of the multiplicity of dynamic input/output interleavers and configured to receive signal information representing characteristics of received signals, including estimated bandwidth of the received signals, and to cause a virtual processing channel to be started on a physical processing unit in accordance with a mapping between a virtual channel number and a processing circuit based on that signal information;

an input channel block communicatively coupled to each dynamic input/output interleaver of the multiplicity of dynamic input/output interleavers and to each physical processing unit of the multiplicity of physical processing units;

an output channel block communicatively coupled to each dynamic input/output interleaver of the multiplicity of dynamic input/output interleavers and to the dynamic interleaving controller; and a clock that outputs clock signals to the multiplicity of physical processing units, the multiplicity of dynamic input/output interleavers, the dynamic interleaving controller, the input channel block and the output channel block.

15. The system as recited in claim 14, wherein the dynamic interleaving controller is configured to:
use the signal information to look up in a circuit/algorithm table a processing circuit configured to process signal samples of a type characterized by the signal information; and
send a virtual channel request to the multiplicity of dynamic input/output interleavers, which request includes data representing the estimated bandwidth of the received signals.

16. The system as recited in claim 15, wherein each dynamic input/output interleaver comprises an interleaving buffer and is configured to determine whether an empty slot exists in the interleaving buffer for a compatible interleaving period that meets bandwidth requirements or not and then send a message to the dynamic interleaving controller containing information representing a result of that determination.

17. The system as recited in claim 16, wherein the dynamic interleaving controller is further configured to select from any dynamic input/output interleavers that have an empty slot a dynamic input/output interleaver with a smallest latency.

18. The system as recited in claim 16, wherein each dynamic input/output interleaver is configured to set up its interleaving buffer and then interleave data with an associated virtual channel number as input to an associated physical processing unit.

19. The system as recited in claim 14, wherein the output channel block is configured to format an output vector that concatenates output from the dynamic input/output interleavers and the signal information representing characteristics of the received signals from the dynamic interleaving controller to form an information vector.

20. A system for processing signals that vary in bandwidth using dynamic interleaving, comprising:
a multiplicity of physical processing units, each physical processing unit comprising a respective multiplicity of processing circuits configured to process signal samples in a pipelined manner and each physical processing unit being configured to process signal samples in accordance with a respective algorithm;

a multiplicity of dynamic input/output interleavers, each dynamic input/output interleaver having an output line connected to an input line of a respective physical processing unit;

a dynamic interleaving controller communicatively coupled to each dynamic input/output interleaver of the multiplicity of dynamic input/output interleavers and configured to receive signal information representing characteristics of received signals, including estimated bandwidth of the received signals, and to cause a virtual processing channel to be started on one or more physical processing units in accordance with a dynamic resource sharing algorithm that dynamically adjusts the interleaving sequence as new signal processing by newly received signals;

an input channel block communicatively coupled to each dynamic input/output interleaver of the multiplicity of dynamic input/output interleavers and to each physical processing unit of the multiplicity of physical processing units;

an output channel block communicatively coupled to each dynamic input/output interleaver of the multiplicity of dynamic input/output interleavers and to the dynamic interleaving controller; and a clock that outputs clock signals to the multiplicity of physical processing units, the multiplicity of dynamic input/output interleavers, the dynamic interleaving controller, the input channel block and the output channel block.

21. The system as recited in claim 20, wherein:
the dynamic interleaving controller is configured to use the signal information to look up in a circuit/algorithm table a processing circuit configured to process signal samples of a type characterized by the signal information, and send a virtual channel request to the multiplicity of dynamic input/output interleavers, which request includes data representing the estimated bandwidth of the received signals;

each dynamic input/output interleaver comprises an interleaving buffer and is configured to determine whether an empty slot exists in the interleaving buffer for a compatible interleaving period that meets bandwidth requirements or not and then send a message to the dynamic interleaving controller containing information representing a result of that determination; and the dynamic interleaving controller is further configured to select from any dynamic input/output interleavers that have an empty slot a dynamic input/output interleaver with a smallest latency.

22. The system as recited in claim 20, wherein the output channel block is configured to format an output vector that concatenates output from the dynamic input/output interleavers and the signal information representing characteristics of the received signals from the dynamic interleaving controller to form an information vector.

* * * * *